United States Patent [19]

Buijs

[11] Patent Number: 4,642,590

[45] Date of Patent: Feb. 10, 1987

[54] FREQUENCY MULTIPLIER HAVING OPEN AND SHORT CIRCUITED LINES RESONATING A MULTIPLIED OUTPUT FREQUENCY

[75] Inventor: Johannes H. Buijs, Hilversum, Netherlands

[73] Assignee: U.S. Philips Corporation, New York, N.Y.

[21] Appl. No.: 733,273

[22] Filed: May 10, 1985

[30] Foreign Application Priority Data

May 18, 1984 [NL] Netherlands .................... 8401595

[51] Int. Cl.$^4$ ..................... H03B 19/00; H03B 19/16
[52] U.S. Cl. .................... 333/218; 333/159; 455/323; 455/330; 328/16
[58] Field of Search ............... 333/218; 363/157–159; 307/219.1; 455/313, 323, 325, 330, 333; 331/53; 328/16

[56] References Cited

U.S. PATENT DOCUMENTS 3,381,208  4/1968  Meyahira .................... 333/218
4,211,977  7/1980  Shirkawa et al. ............. 433/330

FOREIGN PATENT DOCUMENTS 0081818  6/1983  European Pat. Off. ........... 363/157
0070732  6/1977  Japan ........................ 333/218

OTHER PUBLICATIONS

Rutz, E. M.; "Optimization Method for High Efficiency Microwave Frequency Doubler", *IBM Technical Disclosure Bulletin*; vol. 7, No. 6, Nov. 1964, pp. 534–535.

Primary Examiner—Eugene R. LaRoche
Assistant Examiner—Benny Lee
Attorney, Agent, or Firm—Thomas A. Briody; Jack Oisher

[57] ABSTRACT

Multipliers for high frequencies having an input and an output. The input is connected via a terminating impedance to the input of a short-circuited transmission line having a length $\lambda/4$, where $\lambda$ is the wavelength of the desired output frequency. The input of the short-circuited transmission line is connected to a point of constant potential via a first impedance and also to the output via a second impedance which is much higher than the terminating impedance. The output is connected to the input of an open-ended transmission line having a length $\lambda/2$.

3 Claims, 4 Drawing Figures

4,642,590

FREQUENCY MULTIPLIER HAVING OPEN AND SHORT CIRCUITED LINES RESONATING A MULTIPLIED OUTPUT FREQUENCY

FIELD OF THE INVENTION

The invention relates to a high-frequency signal multiplier having an input and an output.

BRIEF DESCRIPTION OF RELATED ART

This type of multipliers is used in, for example, digital transmission systems having, for example, a transmission rate of 565 Mb/s for converting a clock signal of frequency f into a different clock signal of frequency $n \times f$. This is, for example, necessary for a change from one line code in the transmission system to an other line code. To realise this, it is, for example, possible to multiply the fundamental frequency of the incoming clock signal to the desired frequency of the outgoing signal. It is common practice to effect this multiplication with the aid of active digital circuits. The active digital circuits are integrated on, for example, a semiconductor body together with other portions of the transmission system. The use of active integrated digital circuits increases the total power dissipation of the semiconductor body. This may cause designing problems, such as an unacceptable amount of heat being generated, given the maximum permissible power dissipation of the semiconductor body.

SUMMARY OF THE INVENTION

The invention has for its object to provide a solution for the above-mentioned problem, and is characterized in that the input is connected through a matching impedance to the input of a short-circuited transmission line having a wavelength $\lambda/4$, where $\lambda$ is the wavelength of the desired output frequency. The input of the short-circuited transmission line is connected to a point of constant potential through a first impedance and also to the output through a second impedance which has much higher impedance than the matching impedance, the output being connected to the input of an open-ended transmission line having a length $\lambda/2$.

The measures according to the invention achieve that the same end result as conventional active digital circuits by using passive components to effect the desired multiplication. As a result thereof, the power dissipation added by the multipliers, which are operative in the system, to the overall power dissipation of the system is substantially nil.

The invention will now be described in greater detail by way of example with reference to the accompanying drawing.

DESCRIPTION OF THE PREFERRED EMBODIMENTS

Figure 1:
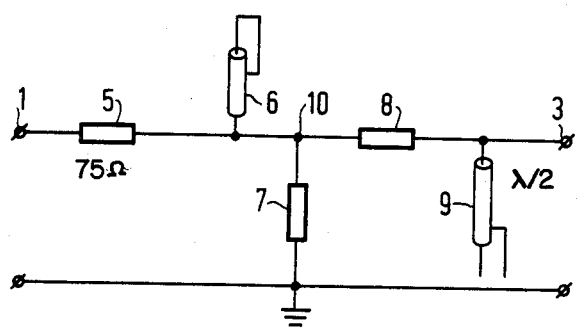
FIG. 1 shows a first embodiment of a frequency multiplier according to the invention, wherein n=3.

In the multiplier shown in FIG. 1, reference numeral 1 denotes the input terminal to which the input signal to be multiplied is applied. The input 1 is connected to the input of a short-circuited transmission line 6 through a matching impedance 5. The input of the short-circuited transmission line 6 is connected to ground by the impedance 7 and also to the output 3 of the multiplier by the impedance 8. The output 3 of the multiplier is connected to the input of an open-ended transmission line 9. The value of the impedance 7 is preferably chosen to be equal to the value of the matching impedance 5. The value of the impedance 8 must be chosen to be much higher than the values of the impedances 5 and 7, so as to make sure that the transmission line 9 is open at both ends and can act as a resonator. The length of the transmission line 6 is equal to $\lambda/4$, wherein $\lambda$ is the wavelength of the desired output frequency. The length of the transmission line 9 is equal to $\lambda/2$.

Figure 2:
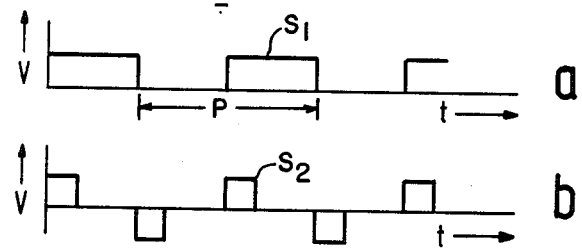
FIG. 2A shows a time diagram of an input signal into the frequency multiplier of FIG. 1.
FIG. 2B shows a differentiated signal at junction 10 of FIG. 1.
FIG. 2C shows the resonated signal of the multiplier of FIG. 1.
Figure 2:
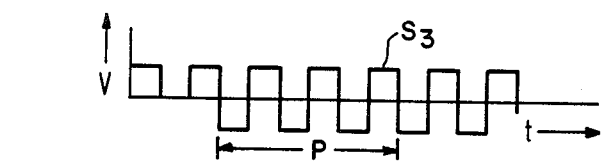

The input signal, for example S1, applied to the input 1 of the multiplier has the shape as shown, for example, in FIG. 2a. This input signal is differentiated with the aid of the short-circuited transmission line 6. This results at point 10 of the multiplier in a signal S2 having approximately the shape as shown in FIG. 2b, including a negative going portion, as well as a positive going portion. If this signal is now applied to the transmission line 9, which is open at both ends, then the transmission line acts as a resonator resonating at the frequency having the wavelength $\lambda$. Thus, any signal input into transmission line 9, after being resonated, would have the characteristic frequency of the transmission line. The output signal S3 at the output 3 of the multiplier has the shape as shown in FIG. 2c. Comparing FIGS. 2a and 2c, it can readily be seen that, for the period designated as P, increased by a factor of 3.

Figure 3:
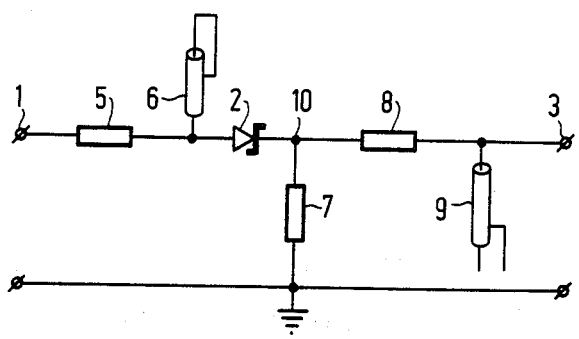
FIG. 3 shows a second embodiment of a frequency multiplier according to the invention, where n=2.
Figure 4:
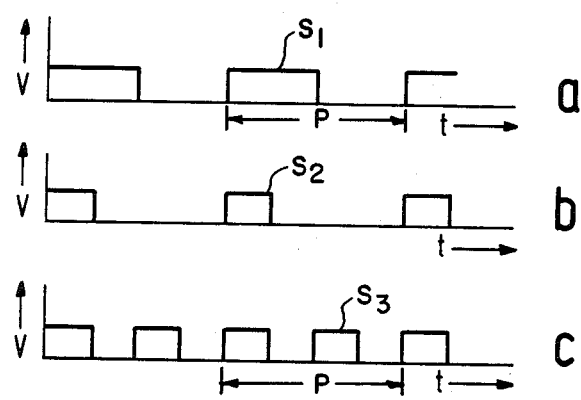
FIG. 4A shows a time diagram of an input signal into the frequency multiplier of FIG. 3.
FIG. 4B shows a time diagram of the differentiated signal at the output of diode 2 of FIG. 3.
FIG. 4C shows the resonated signal at the output of the multiplier of FIG. 3.

If it is desired that the multiplying factor n be even, for example n=2, then either the negative or the positive pulse must be removed after the short-circuited transmission line 6. This can, for example, be realized in a manner as shown in FIG. 3. A diode 2, for example a Schottky diode, is arranged between the input of the short-circuited transmission line 6 and the junction 10 of the impedances 7 and 8. As it is well known that a diode provides unidirectional conduction, the input signal S1 (previously shown in FIG. 2a and now shown in FIG. 4a) after being chopped by diode 2, has a shape as shown by signal S2 in FIG. 4b. The output signal S3 at the output 3 of the multiplier now has a shape as shown in FIG. 4c. Comparing FIGS. 4a and 4c, it can readily be seen that the output signal has now been multiplied by a factor of 2, for the same period P.

Depending on the frequency range in which the digital transmission system operates, the transmission lines 6 and 9 can be realized with the aid of printed conductors, cables, microstrips etc.

Thus, there is described with respect to one embodiment, a frequency multiplier in accordance with the invention. Those skilled in the art will recognize yet other embodiments defined more particularly by the claims which follow.

What is claimed is:

1. A frequency multiplier for generating a desired output frequency comprising:
   a matching impedance having a first end for receiving an input signal;
   a short-circuited transmission line having an input connected to a second end of said matching impedance for receiving said input signal, said short-circuited transmission line having a wavelength λ/4 for differentiating said input signal, where λ is the wavelength of said desired output frequency;
   a first impedance having a first end connected to said input of said short-circuited transmission line and a second end connected to a point of constant potential for effecting a path between said input of said short-circuited transmission line and said point of constant potential;
   a second impedance having a first end connected to said input of said short-circuited transmission line and a second end forming an output of said multiplier, said second impedance having substantially higher resistance than said matching impedance; and
   an open-ended transmission line having an input connected to said second end of said second impedance for receiving said differentiated input signal, said open-ended transmission line having a wavelength λ/2 for resonating said differentiated input signal to said desired output frequency.

2. A frequency multiplier for generating a desired output frequency comprising:
   a matching impedance having a first end for receiving an input signal;
   a short-circuited transmission line having an input connected to a second end of said matching impedance for receiving said input signal, said short-circuited transmission line having a wavelength λ/4 for differentiating said input signals, where λ is the wavelength of said desired output frequency;
   a diode having a first end connected to said input of said short-circuited transmission line for receiving said differentiated input signals and providing differentiated input signal pulses having the same polarity;
   a first impedance having a first end connected to an output of said diode and a second end connected to a point of constant potential for effecting a path between said input of said diode and said point of constant potential;
   a second impedance having a first end connected to said first end of said first impedance and said output of said diode and a second end forming an output of said multiplier, said second impedance having substantially higher resistance than said matching impedance;
   an open-ended transmission line having an input connected to said second end of said second impedance for receiving said differentiated input signal pulses, said open-ended transmission line having a wavelength λ/2 for resonating said differentiated input signal pulses to said desired output frequency.

3. A multiplier according to claim 2, wherein said diode is a Schottky diode.

* * * * *